United States Patent [19]

Evans, Jr. et al.

[11] 4,104,091

[45] Aug. 1, 1978

[54] APPLICATION OF SEMICONDUCTOR DIFFUSANTS TO SOLAR CELLS BY SCREEN PRINTING

[75] Inventors: John C. Evans, Jr., North Olmsted; Henry W. Brandhorst, Jr., Berea; George A. Mazaris, Brookpark; Larry R. Scudder, Berea, all of Ohio

[73] Assignee: The United States of America as represented by the Administrator of the National Aeronautics and Space Administration, Washington, D.C.

[21] Appl. No.: 799,026

[22] Filed: May 20, 1977

[51] Int. Cl.² .......................................... H01L 21/225
[52] U.S. Cl. .................................... 148/188; 29/572; 136/89 C; 427/75
[58] Field of Search ................. 148/188; 427/282, 75; 136/89 C; 29/572

[56] References Cited

U.S. PATENT DOCUMENTS

| 3,287,187 | 11/1966 | Rosenheinrich | 148/188 |
| 3,518,756 | 7/1970 | Bennett et al. | 427/282 |

Primary Examiner—M. J. Andrews
Attorney, Agent, or Firm—N. T. Musial; J. R. Manning; G. E. Shook

[57] ABSTRACT

Diffusants are applied onto semiconductor solar cell substrates using screen printing techniques. The method is applicable to square and rectangular cells and can be used to apply dopants of opposite types to the front and back of the substrate. Then, simultaneous diffusion of both dopants can be performed with a single furnace pass.

6 Claims, No Drawings

APPLICATION OF SEMICONDUCTOR DIFFUSANTS TO SOLAR CELLS BY SCREEN PRINTING

ORIGIN OF THE INVENTION

The invention described herein was made by employees of the U.S. Government and may be manufactured or used by or for the Government without the payment of any royalties thereon or therefor.

BACKGROUND OF THE INVENTION

1. Field of the Invention

This invention relates to a process for applying diffusants to solar cell semiconductor substrates using screen printing techniques.

2. Description of the Prior Art

Several semiconductor diffusant application methods are presently known. These include spinning, spraying, brush painting and vapor transport. (See, for example, U.S. Pat. No. 3,837,873.) However, each of these processes has significant disadvantages associated therewith.

In a typical spinning operation, one drop of a "diffusion source" solution is applied to the center of a semiconductor wafer, such as silicon, which is spinning at approximately 3,000 revolutions per minute. Centrifugal force spreads the material in a fairly uniform layer over the wafer's surface. However, non-uniformity due to perimeter pileup is a problem. Since the wafer is generally held down by a vacuum, there is a tendency for leakage. Some of the liquid dopant tends to flow off the edge and stain or contaminate the opposite side of the wafer. After the top surface film has been preliminarily dried but before diffusion is effected, a clean-up procedure is thus required. It is not usually feasible to coat both sides of a wafer with different dopants by this process. It also does not lend itself easily to automation.

Spraying is usually accomplished while the wafer is supported on a pedestal and is a form of spray painting. Once again, contamination of the opposite face may occur and both sides cannot be coated with different diffusants. It is also difficult to automate and non-uniformity is a problem.

In the brush painting technique, the dopant solution is applied by hand painting with a fine camel's hair brush. It is then typically dried for 15 minutes in air at 150° C. The opposite face may be similarly hand painted with a different dopant and then dried in a similar manner before the wafer is diffused by heating at high temperature. The obvious disadvantages of this coating method, although it allows both sides to be coated and simultaneously diffused, are that the process is a hand operation, is necessarily slow and does not produce uniform or complete surface covering. Moreover, thickness variations in the dopant application may produce junction depth variations after diffusion. Of course, it is not automatable.

The vapor transport method is used to diffuse dopants into semiconductor wafers by having the dopant carried in a vapor from a source in a diffusion furnace. One method involves the placing of a solid source quite close to the wafer, e.g., Si, with a uniform spacing between the solid dopant source (often a similar wafer) and the surface of the silicon. When this process is used in an attempt to apply different diffusants to opposite faces of the wafer, e.g., P and B, cross-contamination occurs.

As can be seen, there is a need for an automatable technique of applying diffusants to one or both sides of a solar cell substrate in a reproducible and controlled fashion. With the current emphasis on the development of alternate energy sources, development of techniques to produce large quantities of solar cells at the lower costs possible with automation, is particularly critical. It would also be desirable to further production economy by simultaneously diffusing front and back dopants with a single diffusion firing. Such a process has been suggested (U.S. Pat. No. 3,895,975) but is subject to various disadvantages since it involves heating the substrate to a molten alloy state and also involves a pre-heating deposition of a diffusant by conventional techniques followed by a second vapor phase deposition during the actual heating step.

SUMMARY OF THE INVENTION

Accordingly, it is one object of the present invention to provide an automatable and simple method for applying diffusants to a solar cell substrate so that the properties of the diffusant coatings are reproducible and controllable.

It is another object of this invention to provide such a method which can be used to apply diffusants to opposite faces of solar cell substrates without cross-contamination.

It is yet another object to provide a method of applying diffusants to opposite faces of a substrate whereby both diffusants can subsequently be simultaneously diffused into the substrate.

Briefly, these and other objects of this invention, as will hereinafter become clear, have been attained by providing an automatable method for doping solar cell substrates which comprises applying a dopant-containing diffusant onto the substrate by a screen printing technique and thereafter heating the substrate at a temperature effective for diffusing the dopant into the substrate. Prior to the diffusion heating step, both sides of the substrate may be screen printed with diffusants of opposite conductivity. Thereafter, simultaneous diffusion of both dopants can be accomplished in a single heating step.

DETAILED DESCRIPTION OF THE PREFERRED EMBODIMENTS

The method of this invention is applicable to doping of semiconductor substrate solar cells such as silicon wafers. It is especially useful for applying diffusants to current silicon solar cells used in high density arrays for the space program. Such cells are typically square or rectangular. Thus, the popular spin-on technique which is somewhat useful for circular cells is not applicable. Other homojunction devices wherein diffusion into a crystalline lattice host material is used to produce the p-n junction, such as gallium arsenide cells, are also most suitable for diffusant printing.

The current space solar cell is a square or rectangular wafer cut from single crystal silicon and finished to a thickness on the order of 8 mils or approximately 200 micrometers. The back surface is lapped and the front surface "texturized" to produce pyramids typically of ten micrometers maximum height. Square cells are generally two centimeters on a side and the rectangular cells generally are two centimeters by four centimeters in size. Of course, the size or thickness of the solar cell is not critical in the method of this invention.

Also not critical for the method is the selection of the specific dopants and electrical properties of the substrate. These are chosen in accordance with completely conventional considerations with respect to the desired donor and/or acceptor concentrations, resistivities, conversion efficiencies, etc.

In order to utilize the higher energy portions of the solar spectrum in outer space, the front photovoltaic junction depth generally does not exceed one half of a micrometer. Such blue or violet sensitive cells exhibit high space conversion efficiencies, particularly when light trapping schemes such as surface texturizing or anti-reflection coatings are employed. For the front junction diffusion into p-type wafers, phosphorus, arsenic or antimony are usually selected. A surface donor concentration ($N_d$) equal to $10^{19}$ or $10^{20}$ atoms per $cm^3$ is generally sought with a consequent junction depth ($X_j$) of 0.1 to 0.5$\mu$M. The sheet resistance ($R_{sh}$) is typically 100 to 300 ohms per square.

Preparation of the wafer surfaces for the screen printing step involves conventional procedures such as lapping the back surface, texturizing the front surface, and removing grease, cutting oils and chemicals. For example, the wafers can be soaked in concentrated nitric acid for 5 minutes and rinsed in deionized water before application of the dopant. This step may be followed by an alcohol or acetone rinse followed by drying in clean heated air.

The screen printing operation can be accomplished with conventional and commercially available screen printing apparatus such as automated printing machines including the de Haart Semi-Automatic Screen Printer Model SP-SA-5.

Such devices have been used in the past for screen printing of non-diffusant coatings onto semiconductor substrates, e.g., conductors, resistors, capacitors, etc., in designated patterns with high quality control. They are also conventionally used in production of printed circuits and other metallization operations. Consequently, the details of device operation and the selection of appropriate device parameters for the application to the method of this invention are fully conventional unless otherwise specified herein. These can be determined by routine conventional considerations. (See, for example, *Screen Printing of Microcircuits,* D. C. Hughes, Jr., Dan Mar Publishing Company (New Jersey, 1967).) The ability to print a pattern or a controlled area as is required by most conventional uses of screen printing is, of course, a further advantage of this invention.

Suitable diffusants for use in the method of this invention are also readily available. For example, modified Emulsitone Emitter Diffusion Sources among others can be used. These have been used in the past only in conjunction with conventional spinning, dipping, hand painting and spray painting operations. Such diffusant solutions contain dopant atoms attached to low molecular weight polymers. Upon drying, and heating to the doping temperature, a film forms on the solar cell surface consisting of a glass-like layer of a silica ($SiO_2$) matrix (for silicon substrates) with the dopant element dispersed throughout and uniformly available for diffusion into the silicon wafer. Both donor and acceptor solutions are available with all of the standard elements, e.g., P, As, Sb, B, Al, etc.

The diffusant solutions must possess a viscosity suitable for use in the conventional screen printing devices and should be selected to control the thickness of the resulting layer and the concentration of dopant per unit area therein. Appropriate viscosities can be selected by routine experimentation using fully conventional considerations. (See, for example, pages 52–62 of the above-mentioned Hughes text.) Typical viscosities are in the range of 50 to 150 cps, preferably 120 to 150 cps.

Since the surface concentration of the dopant is dependent upon the concentration ratio of dopant to silica in the layer formed upon heating of the diffusant solution, the latter parameter must be appropriately selected. Suitable dopant to silica ratios are preferably 1 to 10. Suitable dopant concentrations in the printing paste are from 0.05 to 0.1 g. atom/ml, preferably from 0.075 to 0.1 g. atom/ml. Such ratios and concentrations conveniently provide donor and acceptor concentration levels on the order of $10^{19}$ – $10^{20}$ as required in solar cells. Appropriate ratios and concentrations for any system can be determined easily. For purposes of illustration, one suitable manner for determining appropriate parameters is given below.

Current solar cell technology enables the spectral response of silicon solar cells to be tailored. For example, a solar cell made for use in outer space can take advantage of the higher energy portion of the solar spectrum which does not reach the Earth due to atmospheric attenuation or absorbtion. Thus, "violet" or blue-responsive solar cells having very shallow junctions have been developed and are highly efficient in outer space. These have a very high surface concentration of n-type dopant, usually phosphorus, which concentration grades down rapidly to the junction depth which may lie less than one-half micrometer from the surface. The doping level for such cells at the surface may be as high as $5 \times 10^{20}$ atoms/$cm^3$.

To achieve such high surface dopant concentrations with a print type diffusant, it is necessary to have the dopant level an order of magnitude higher in the source material ($5 \times 10^{21}$). Following are examples of ratios of phosphorus in the parent dopant layer which results from drying the applied material, and the doping level of phosphorus in the topmost layer of the silicon wafer which results from diffusion heating:

| PHOSPHOROSILICAFILM | |
| --- | --- |
| C ($SiO_2$) | $C_o$ (surface concentration) |
| P Atoms/$cm^3$ of $SiO_2$ | P atoms/$cm^3$ of Silicon |
| $5 \times 10^{21}$ | $5 \times 10^{20}$ |
| $7 \times 10^{20}$ | $8 \times 10^{18}$ |
| $3 \times 10^{19}$ | $5 \times 10^{17}$ |

In addition to the above formulations, other surface concentrations may be achieved by mixing the solutions to obtain intermediate values. The phosphorus doped silica layer provides an erfc source, and the sheet resistance decreases linearly, for a given diffusion temperature, with the square root of the diffusion time.

Conventionally, these glass-forming solutions are made up with given dopant ratios of phosphorus or other dopant to silica (in the resulting doped layer from which the diffusant comes to enter the silicon wafer). According to the semiconductor characteristics of the device being made, the liquid which is needed is selected and applied by one of the known methods, which until this invention, did not include a paste or gel formulation for screen printing. However, the same conventional technology for preparing appropriate pastes or gels carries over to the new method of this invention.

The high viscosity gel may contain as much as 30% by weight of the phosphorus bearing silica material. When printed thick enough to leave a lyer one micrometer in thickness (after drying in air at 150° C for several minutes), the one micrometer thick layer would contain:

$(5 \times 10^{21}/10^4) = 5 \times 10^{17}$ atoms of phosphorus per $cm^2$ or 25 micrograms of phosphorus.

This amount is many times more than is required for the solar cell diffusion involved with the shallow junction devices. As can be seen, suitable dopant-to-silica ratios are, for phosphorus, $5 \times 10^{21}$ atoms per cubic centimeter, and this is 0.25 grams of phosphorus in each $cm^3$ of silica. But, since the dopant makes up only 30% (generally from 10–30% of the printed dopant, i.e., 90–70% silica) of the thick paste or gel, the ratio of phosphorus dopant to milliliter of paste or gel is:

30% of 0.25 grams = 0.075 grams per milliliter gel (phosphorus content)

For boron pastes slightly higher sheet resistances result with any given concentration and so slightly longer diffusion times are required to achieve any value which would be achieved with a phosphorus doping.

For the shallow junction diffusions involved in solar cells of the space variety, the resulting surface concentration of the dopant atoms is conveniently independent of the applied thickness. However, the paste should be compounded so as to leave, upon drying a layer not to exceed 1 micrometer in thickness; otherwise cracking may occur. Alternately, other paste components such as glycerol, ethylene glycol, and the like can be incorporated in the paste along with the dopant to prevent cracking. Suitable amounts of glycerol, for example, include from 0.5 to 1.0 gm/ml, preferably from 0.5 to 0.7 gm/ml of paste.

The proper viscosities, dopant concentrations, and layer thicknesses can be simultaneously achieved by preparing solutions in conventional fashion or by conventionally modifying commercial solutions.

Generally speaking, all screen printing pastes made up for electronic purposes, whether conductor or resistor inks, metals for capacitors or diffusants, contain three components, viz:

(a) the active material. In the case of a print-on conductor, this may be a metal, alloy, mixture of powdered metals or metals incorporated chemically in a carrier which decomposes leaving the metallic deposit.

(b) A low melting point glass which serves as a permanent binder. In the case of print-on diffusants, the silica glass binds the dopant element and it proceeds to diffuse from this matrix into the silicon or other semiconductor.

(c) Organic additives which are used to obtain the desired viscosity or fluid properties. These are very numerous but the main criterion is to select those which will be eliminated from the printed design during the early heating stages of the firing. These organics always cntain large amounts of carbon which could be deleterious to the properties desired in the printed material if it remained. Thus, alcohols, organic solvents, water, the corresponding esters of higher alcohols, specifically materials such as glycerin, ethylene glycol, alpha or beta terpineol, etc., may be used and will evaporate during the early phases of the firing cycle. Glycerin has a very high viscosity (945 cp. at 25° C) and may be mixed in small amounts to achieve values such as around 150 cp. desired herein.

With these general guidelines, a desired set of properties may be easily compounded into the paste with minor trial and error. Glycerin will thicken, methanol will thin, etc. The ratio of dopant to silica in the resulting film stays constant.

The application of diffusant by screen printing may be accomplished by applying the material to one surface only, followed by diffusion heating; or to both front and back surfaces prior to a single diffusion heating treatment.

The parameters of heating time and temperature are conventionally chosen in accordance with the desired junction depth, since the level to which the dopant atoms diffuse is directly proportional to these conditions. For solar cells of the space type, suitable temperatures are from 850° to 950° C for from 1½ to ¾ hours, preferably from 850° to 900° C for from 1½ to 1 hours. Inert gas atmospheres are preferred for the heating treatment since an oxygen-containing atmosphere may result in the formation of a layer of $SiO_2$ which will dilute the dopant to silica ratio and alter the diffusion results drastically. Suitable inert gases include Ar, $N_2$, etc. When both sides of the wafer are printed prior to heating, the diffusant may be applied first to one surface and then dried in flowing air heated to from 100° to 200° C, preferably 150° to 200° C. Subsequently, the other face is printed with a suitable diffusant and similarly dried. Simultaneous diffusion of both dopants is then effected by heating to suitably high temperatures. Of course, if the time/temperature parameters for the two sides are incompatible, prior diffusion of the deeper descending diffusant for a suitable time at a suitable temperature prior to printing of the other side can be employed. Subsequent heating of the wafer at appropriately selected temperatures and times can be used to further diffuse the first diffusant to its final depth and simultaneously diffuse the second printed diffusant to its appropriate depth.

During the diffusion heating treatment, the wafers may be stacked as coins with the wafers alternated so that similarly doped faces are together. The wafers may also be diffused in a traveling furnace or other conventional heating devices. After the diffusing treatment, the wafers are generally cleaned of residue using conventional techniques such as hydrofluoric acid washing. They can then be ground and/or contacted, as is customary.

Diffusion profile studies have shown that the process of this invention results in virtually none of the lattice disturbance normally associated with the diffusion of large amounts of dopants such as phosphorus into silicon crystals. Moreover, the diffusion profile is an error function or erfc for diffusion down to five micrometers in depth.

Having generally described the invention, a more complete understanding can be obtained by reference to the following specific example, which is provided herein for purposes of illustration only and is not intended to be limiting unless otherwise specified.

EXAMPLE

Emulsitone N-250 phosphorus silica "Emitter Diffusion Source" and Emulsitone Borosilicafilm 5257 were modified by the addition of Emulsitone thickener (glycerol may also be used) to achieve a viscosity of approximately 150 centipoise for each paste for printing. Using a de Haart Semi-Automatic Screen Printer MOdel SP-SA-5 and suitable 325 mesh stainless steel printing masks, two shapes of silicon wafers were screen-print coated with the diffusant pastes. The wafers, of orientation 100, had nominal resistivities of 5-12 ohm-cm and were of boron doped p-type silicon. The wafers were cut and lapped to a thickness of ten thousanths of an inch (10 mils) or approximately 250 micrometers.

One side of the subject wafers was printed with the N-250 phosphorus dopant paste and the wafer was dried in nitrogen at 200° C for 15 minutes to densify and stabilize the first coating by driving off much of the solvent. The resulting layer was approximately 1 micrometer or less in thickness.

The remaining wafers were similarly printed with the n-type dopant paste and the machine was carefully cleaned in preparation for printing the opposite faces with p-type dopant paste. This was made by the addition of thickener to Emusitone Borosilicafilm 5257 to achieve printing consistency. The opposite or p-doped sides were likewise dried in nitrogen to densify the coatings.

For the initial experiments, diffusion times and temperatures were varied with the optimum being found to be approximately 900° C for 1 hour in air. The first wafers printed were 1 × 2 centimeter rectangular, but other sizes included 2 × 2 cm. square and 2 inch diameter circular.

Having now fully described this invention, it will be apparent to one of ordinary skill in the art that many changes and modifications can be made thereto without departing from the spirit or scope of the invention set forth herein.

What is claimed as new and intended to be secured by Letters Patent is:

1. An automatable method for doping a solar cell substrate of the flat wafer type having opposed surfaces which comprises screen printing onto each of said opposed surfaces a layer of a glass-forming chemical containing an electrical-type dopant which molecularly bonds to a resulting glass coating, the dopant in said chemical on one of said surfaces being of a first electrical type and the dopant in said chemical on the opposed surface being of a second electrical type, heating said printed substrate at a first elevated temperature to remove volatiles from said layer and to dry the same, and thereafter heating said printed substrate at a second elevated temperature greater than said first elevated temperature to form said glass coating of said opposed surfaces of said substrate, said second elevated temperature being effective to simultaneously diffuse both of the dopants into said substrate.

2. The method of claim 1, wherein the second elevated heating step is conducted at 850° to 950° C for about 1½ to ¾ hours.

3. The method of claim 1, wherein said solar cell substrate is rectangular in shape.

4. The method of claim 1, wherein said chemical comprises a paste having a viscosity of 50 to 150 cps and the resulting print comprises from 10 to 30% by weight of the dopant and from 90 to 70% of silica.

5. The method of claim 1, wherein the thickness of the screen printed layer on the solar cell substrate is less than 1μ.

6. An automated method for doping a square or rectangular silicon solar cell substrate suitable for space applications which comprises:

screen printing and drying onto one surface of said substrate a solution containing a dopant, screen printing and drying onto an opposite surface a solution containing another dopant of opposite conductivity to said first dopant, wherein said solutions have a viscosity of 50 to 150 cps. and the concentration of said dopants in the print is from 10 to 30% and wherein said solutions are printed to a thickness less than 1μM, and thereafter heating said substrate at 850° to 950° C for about 1½ to ¾ hours to simultaneously diffuse said dopants into said substrate.

* * * * *